United States Patent
Fuller et al.

(10) Patent No.: US 7,095,278 B2
(45) Date of Patent: Aug. 22, 2006

(54) POWER AMPLIFIER ARRANGEMENT AND METHOD FOR MEMORY CORRECTION/LINEARIZATION

(75) Inventors: Arthur Thomas Gerald Fuller, Kanata (CA); Bradley John Morris, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 194 days.

(21) Appl. No.: 10/900,300

(22) Filed: Jul. 28, 2004

(65) Prior Publication Data

US 2006/0022751 A1    Feb. 2, 2006

(51) Int. Cl.
*H03F 1/26* (2006.01)
(52) U.S. Cl. .................................... 330/149; 375/297
(58) Field of Classification Search ................ 330/149, 330/10, 129, 136; 375/297; 455/63
See application file for complete search history.

(56) References Cited

U.S. PATENT DOCUMENTS

| | | | |
|---|---|---|---|
| 6,118,335 A | 9/2000 | Nielsen et al. | 330/2 |
| 6,320,463 B1 | 11/2001 | Leva et al. | 330/149 |
| 6,462,617 B1 | 10/2002 | Kim | 330/2 |
| 6,600,369 B1 * | 7/2003 | Mitzlaff | 330/149 |
| 6,646,501 B1 * | 11/2003 | Wessel | 330/10 |
| 6,774,719 B1 * | 8/2004 | Wessel et al. | 330/136 |

OTHER PUBLICATIONS

Vuolevi, Joel; Manninen, Jani; Rahkonen, Timo; Cancelling the Memory Effects in RF Power Amplifiers; IEEE, 2001, pp. 1-57 to 1-60.

Ding, Lei, et al.; A Robust Digital Baseband Predistorter Constructed Using Memory Polynomials; IEEE Transactions on Communications, vol. 52, No. 1, Jan. 2004, pp. 159-165.

* cited by examiner

*Primary Examiner*—Henry Choe (57) ABSTRACT

A device, system, and method are provided for a power amplifier arrangement. In embodiments of a Vdd modulated power amplifier arrangement, a memory correction block includes a Vdd predictor for predicting waveform distortions of a Vdd modulated power supply and a main-path corrector for pre-distorting the input to the power amplifier arrangement as a function of the input to the power amplifier arrangement, an input envelope signal determined as a function of the input to the power amplifier arrangement, and an output of the Vdd predictor. Embodiments of the invention provide for operating power amplifier arrangements having memory. In some embodiments, methods of training the Vdd predictor and the main-path corrector of the memory correction block are provided.

30 Claims, 7 Drawing Sheets

POWER AMPLIFIER ARRANGEMENT AND METHOD FOR MEMORY CORRECTION/LINEARIZATION

FIELD OF THE INVENTION

The invention relates to power amplifiers with modulated power supplies.

BACKGROUND OF THE INVENTION

A conventional power amplifier arrangement having a power amplifier supplied by a static or constant power supply is inefficient and wasteful.

One of the current focuses in power amplification design is improved efficiency. Improvements in efficiency lead to a reduced amplifier cost, for example by allowing the use of less expensive transistors with reduced power handling capability, as well as reduced operating expenses resulting from such factors as reduced size, reduced cooling requirements and reduced power requirements.

One method of obtaining improved efficiency is to modulate a power supply of the power amplifier, for example by using a Vdd modulator. In this way, a power supply signal is modulated as a function of an envelope of an input to the power amplifier arrangement.

The modulated power supply technique has several drawbacks that have an effect on the linearity of a power amplifier. Typically, the Vdd modulator has a finite bandwidth and therefore can not always exactly track the envelope of the input signal. The finite bandwidth of the Vdd modulator has an effect on the gain and phase response of the amplifier.

Effects such as these introduce distortion, which is referred to as "memory", due to the fact that the effects are a function of past values of the input. The distortion may be addressed when the input to the amplifier is linearized in order to produce an output signal that meets standards requirements for emissions, such as the adjacent channel leakage ratio (ACLR) defined in 3GPP. The majority of conventional linearization techniques assume that the amplifier is memoryless. Therefore, proper linearization of the output signal is not achieved and the amplified signal contains distortion if the amplifier has memory.

Linearization correction techniques that are able to address memory impairments typically suffer from additional limitations. One such limitation is that the techniques begin with the assumption that the distortion is only a function of the input envelope. This is not always true. Another such limitation is that the techniques are very computationally expensive and require large amounts of memory and/or logic resources that typically grow exponentially with the order of a model used in the technique.

SUMMARY OF THE INVENTION

According to one broad aspect, the invention provides a power amplifier arrangement comprising: a power supply adapted to supply a power supply signal to a power amplifier, the power supply being modulated as a function of an input signal supplied to the power amplifier arrangement; the power amplifier adapted to receive a modified version of the input signal and amplify the modified version of the input signal to produce an output signal; wherein the input signal is modified as a function of the input signal supplied to the amplifier arrangement and a prediction of distortion of the power supply signal supplied to the power amplifier.

In some embodiments, the invention provides a power amplifier arrangement as aforesaid, wherein the power amplifier arrangement includes a memory correction module adapted to provide the modified input signal supplied to the power amplifier, the memory correction module modifying the input signal as a function of the input signal to the arrangement and a prediction of distortion of the power supply signal supplied to the power amplifier, the memory correction module being trained as a function of the output signal.

In some embodiments, the memory correction module modifies the input signal as a function of a prediction of distortion of the power supply signal, wherein the distortion results from a dynamic impedance effect of the power amplifier as seen by the power supply.

In some embodiments, the memory correction module modifies the input signal as a function of an input signal envelope of the input signal supplied to the power amplifier arrangement.

In some embodiments, the memory correction module is comprised of a Vdd predictor adapted to predict waveform distortion of the power supply signal, wherein the Vdd predictor generates an output that is a function of a target power supply signal, the target power supply signal modulated as a function of the input signal and unaffected by the waveform distortion; and a main-path corrector adapted to modify the input signal supplied to the power amplifier arrangement as a function of the input signal supplied to the amplifier arrangement and the output of the Vdd predictor.

In some embodiments, inputs supplied to the main-path corrector comprise an input signal, the output of the Vdd predictor and an input envelope signal.

In some embodiments, inputs supplied to the Vdd predictor comprise an input envelope signal and the target power supply signal.

In some embodiments, a power amplifier arrangement further comprises means for generating an input envelope signal prior to the Vdd predictor and the main-path corrector.

In some embodiments, a power amplifier arrangement further comprises means for modulating the power supply signal as a function of the input signal.

In some embodiments, means for modulating the power supply signal are a function of an input envelope signal.

In some embodiments, means for modulating the power supply signal comprise rectification of the input signal.

In some embodiments, means for modulating the power supply signal further comprise filtering of the input signal.

In some embodiments, the memory correction module is an application specific integrated circuit (ASIC).

In some embodiments, the memory correction module is a field programmable gate array (FPGA).

In some embodiments, a power supply arrangement comprises: a Vdd predictor training function adapted to train the Vdd predictor; a main path corrector training function adapted to train the main path corrector.

In some embodiments, the Vdd predictor training function is adapted to train the Vdd predictor using the target power supply signal, the power supply signal and the input signal; the main path corrector training function is adapted to train the main path corrector using the modified input signal, the output signal and the power supply signal.

According to another broad aspect, the invention provides a computer useable medium having computer readable program code means embodied therein for performing memory correction in a power amplifier arrangement, the computer readable code means comprising: code means for predicting waveform distortion of the power supply signal, wherein the code means generates an output that is a function of a target power supply signal, the target power supply signal modulated as a function of the input signal supplied to the amplifier arrangement and unaffected by the waveform distortion; and code means for modifying the input signal supplied to the power amplifier arrangement as a function of the input signal to the power amplifier arrangement and the output of the code means for predicting waveform distortion.

According to another broad aspect, the invention provides a method of operating a power amplifier arrangement comprising a power amplifier and a power supply, the method comprising the steps of: modulating a power supply signal of the power supply as a function of an input signal supplied to the power amplifier arrangement and the power supply signal being supplied to the power amplifier; modifying the input signal supplied to the power amplifier arrangement as a function of the input signal supplied to the amplifier arrangement and a prediction of distortion of the power supply signal supplied to the power amplifier.

In some embodiments, the step of modifying further includes the steps of: Vdd prediction for predicting waveform distortion of the power supply signal, wherein the Vdd predictor generates an output that is a function of a target power supply signal, the target power supply signal modulated as a function of the input signal supplied to the amplifier arrangement and unaffected by the waveform distortion; and main-path correction for modifying the input signal supplied to the power amplifier arrangement as a function of the input signal to the power amplifier arrangement and the output of the Vdd predictor.

In some embodiments, the step of modifying further comprises converting signals represented in a fixed-point domain to signals represented in a floating-point domain and vice versa.

In some embodiments, a method further comprises a training step for determining programmable parameters used during at least one of Vdd prediction and main-path correction.

In some embodiments, the training step involves using a least squares optmization process according to the equation $\phi=[U^H \cdot U]^{-1}Y$ where U is a M×N matrix of system inputs, Y is a M×1 vector of a corresponding outputs, $\phi$ is a N×1 vector of the resulting programmable parameters, M is a number of samples captured per iteration, N is a number of discrete sample weightings and superscript H pertaining to $U^H$ represents a conjugate transpose operator.

In some embodiments, the training step involves segmenting of a solution space into a plurality of ranges to aid in reducing complexity of determining programmable parameters or to enhance performance.

In some embodiments, an overlap is provided between adjacent segments in the plurality of ranges.

In some embodiments, the step of Vdd prediction further comprises the step of interchanging programmable parameters somewhere in the overlap.

In some embodiments, the step of main-path correction further comprises the step of interchanging programmable parameters somewhere in the overlap.

According to another broad aspect, the invention provides a memory correction module for a power amplifier arrangement comprising a Vdd predictor adapted to predict waveform distortion of the power supply voltage, wherein the Vdd predictor generates an output that is a function of a target power supply voltage, the target power supply voltage being modulated as a function of an input supplied to the power amplifier arrangement and unaffected by the waveform distortion; and a main-path corrector adapted for modifying the input supplied to the power amplifier arrangement as a function of the input to the power amplifier arrangement and the output of the Vdd predictor.

In some embodiments, a wireless communications base station transmitter including a power amplifier arrangement as summarized above.

In some embodiments, a communications network including a power amplifier arrangement as summarized above.

In some embodiments, a method of providing a signal transmission service over a communications network including a power amplifier arrangement as summarized above.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
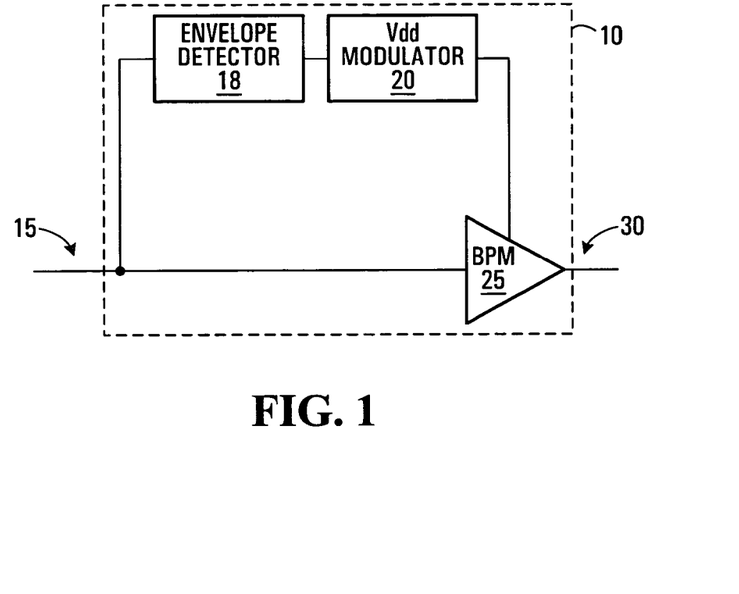
FIG. 1 is a block diagram of a power amplifier arrangement.

Referring to FIG. 1, a power amplifier arrangement 10 will be described in detail. The power amplifier arrangement 10 includes an input 15, an output 30, an envelope detector 18, a Vdd modulator 20 and a power amplifier referred to herein as a basic power module (BPM) 25. The input 15 is coupled to the BPM 25. The input 15 is also coupled to the Vdd modulator 20 via the envelope detector 18. The Vdd modulator 20 is a power supply that modulates a power supply signal as a function of the envelope of the signal applied at the input 15. An output of the Vdd modulator 20 is coupled to the amplifier 25. An output of the BPM 25 is coupled to the output 30.

In operation, a signal is applied to the input 15. The Vdd modulator 20 modulates the power supply signal as a function of the input signal envelope received from the envelope detector 18. The modulated power supply signal is used to power the BPM 25. The BPM 25 amplifies the signal applied to the input 15 of the power amplifier arrangement 10.

When tracking the input signal envelope, if the Vdd modulator 20 outputs a supply voltage to the BPM 25 of less than a given minimum amplitude, the BPM 25 cannot provide sufficient gain to the signal supplied to the power amplifier arrangement 10. Therefore, an artificial minimum value of the supply voltage is imposed to maintain a minimum desirable level of amplification. Whenever the input signal envelope is below the minimum value, the Vdd modulator 20 supplies a constant power supply signal to the amplifier 25. Applying the artificial minimum has two effects. It results in a non-linearity effect in the amplification of the input signal as the power supply signal does not track the input in a consistent manner. It also contributes to a variable impedance as seen by the Vdd modulator 20 with respect to the amplifier load, referred to as a dynamic impedance effect. The dynamic impedance effect causes distortions or irregularities in the resulting waveform output from the amplifier 25. These irregularities also affect the gain and phase response of the BPM 25.

Figure 2:
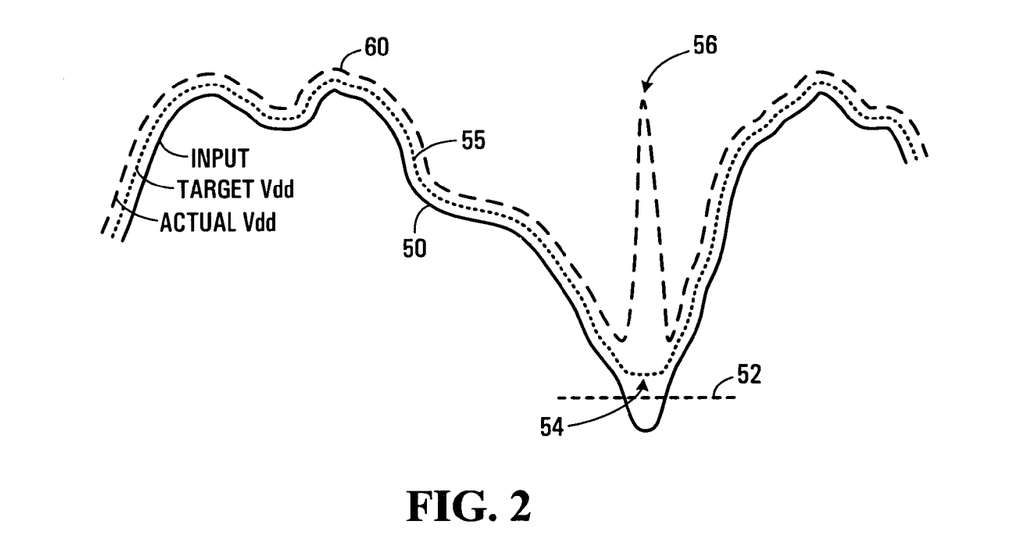
FIG. 2 is a graphical depiction of a collection of signals found in the power amplifier arrangement of FIG. 1.

Shown in FIG. 2 are several signals that occur within the power amplifier arrangement 10 of FIG. 1. Signal 50 represents an input signal envelope, signal 55 represents a target Vdd supply signal generated as a function of the input signal envelope and signal 60 represents an actual Vdd supply signal resulting from the dynamic impedance effect. When the input signal envelope drops below an amplitude shown as dotted line 52, the target Vdd supply signal 55 becomes constant as shown in region 54 until the input signal envelope increases in amplitude above dotted line 52. Due to the dynamic impedance effect, the actual Vdd supply voltage 60 has a voltage spike occurring at region 56. There may be other reasons for the voltage being supplied to the BPM being non-ideal. The dynamic impedance has a significant effect in most instances. The signals 50,55,60 in FIG. 2 are simply shown for illustrative purposes. The signals 50,55,60 do not necessarily reflect proximity or scale of the signals 50,55,60 with respect to one another.

A power amplifier arrangement is provided that is adapted to provide linearization of the output of the power amplifier by pre-distorting the input as a function of the input and a target Vdd modulated power supply signal used to power the power amplifier of the arrangement. This aids in overcoming limitations of conventional linearization techniques.

Figure 3:
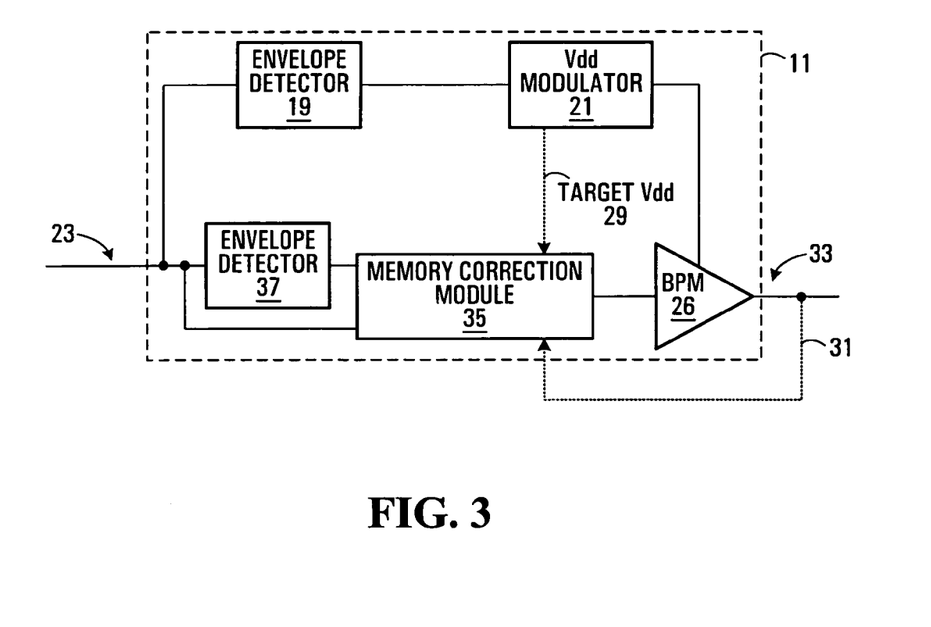
FIG. 3 is a block diagram of a power amplifier arrangement provided by an embodiment of the invention.

Referring to FIG. 3, a power amplifier arrangement 11 according to an embodiment of the invention will now be described.

The power amplifier arrangement 11 of FIG. 3 is similar to that of FIG. 1. There is an envelope detector 19, Vdd modulator 21 and BPM 26. Two new functional blocks have been included in FIG. 3. A first functional block is a memory correction module 35. The memory correction module 35 is coupled to the input 23 of the power amplifier arrangement 11. An output of the memory correction module 35 is coupled to the BPM 26. A second functional block is an envelope detector 37. The envelope detector 37 is coupled to the input 23 of the power amplifier arrangement 11. An output of the envelope detector 37 is coupled to the memory correction module 35. The input 23 is also directly coupled to the memory correction module 35. An output 29 of the Vdd modulator 21 is provided to the memory correction modulator 35 this representing a target Vdd. Also shown is a logical connection 31 between the output 33 of the BPM 26 and the memory correction module 35. This is logical in the sense that it may not be a direct connection. This connection might, for example, represent training of coefficients used in the memory correction module 35 that takes place as a function of the output of the BPM 26.

In operation, the power amplifier arrangement 11 functions in a similar fashion to the power amplifier arrangement 10 of FIG. 1. A difference between the two arrangements is that power amplifier arrangement 11 includes the memory correction module 35 to pre-distort the signal supplied to the BPM 26 to compensate for distortions at least some of which are due to memory which are a function of an input envelope signal. These may be particularly a function of dynamic impedance effects of the BPM 26 as seen by the Vdd modulator 21. To the extent there are other distortions between the desired Vdd and the actual Vdd that drives the BMP 26, the memory correction module 35 may also compensate for these. Outputs from the Vdd modulator 21 and the envelope detector 37 supply input to the memory correction module 35 to aid in the compensation. It is not possible to measure the actual modulated Vdd power supply signal and pre-distort the input signal before it is applied to the BPM 26, instead a prediction is made of the actual modulated Vdd power supply signal and the input signal supplied to the power amplifier arrangement 11 is pre-distorted accordingly before it is input to the BPM 26.

In FIG. 3, two envelope detectors 19,37 are shown. In other embodiments a single envelope detector 19 is provided with outputs to both the memory correction module 35 and the Vdd modulator 21. In some embodiments, the envelope detector 19 may be considered part of the Vdd modulator 21 and the envelope detector 19 internal to the Vdd modulator 21 is coupled to the memory correction module 35. In other embodiments, a single envelope detector is located within the memory correction module 35 and single envelope detector internal to the memory correction module is coupled to the Vdd modulator 21. In still other embodiments, both the memory correction module 35 and the Vdd modulator 21 have their own internal envelope detectors.

In some embodiments, signal delay functionality may be incorporated into the power amplifier arrangement where needed to insure that signals travelling on the main signal path and the Vdd modulator signal path are synchronized.

In some embodiments the processing of the signals in the power amplifier arrangement occurs in the digital domain. As such, signals that are supplied to multiple locations for processing are digitally replicated for multiple use.

In some embodiments, envelope detection is performed by rectification of the input signal supplied to the power amplifier arrangement. An input signal with a finite bandwidth will have an infinite bandwidth after rectification caused by instantaneous transitions in the signal due to the nature of signal rectification. This results in additional distortion because an actual modulated Vdd power supply signal output by the Vdd modulator 21 is a bandlimited signal. In some embodiments rectification takes place prior to digital duplication of the input signal, wherein the duplicated signal is supplied to the Vdd modulator 21. In other embodiments rectification takes place in the Vdd path, prior to the Vdd modulator 21 and the resulting input envelope is supplied to both the Vdd modulator 21 and the memory correction module 35. In further embodiments rectification takes place in the main signal path prior to, or within the memory correction module 35 and the resulting input envelope is supplied to both the Vdd modulator 21 and the memory correction module 35.

In some embodiments a power supply modulation signal is used to modulate the power supply within the Vdd modulator 21. The power supply modulation signal may be a function of the input signal. The power supply modulation signal may be a function of the input envelope signal. In some embodiments the power supply modulation signal may be the input envelope signal.

In a proceeding paragraph rectification was described as a method of envelope detection. More generally, other known signal processing methods can be used for envelope detection.

Figure 4:
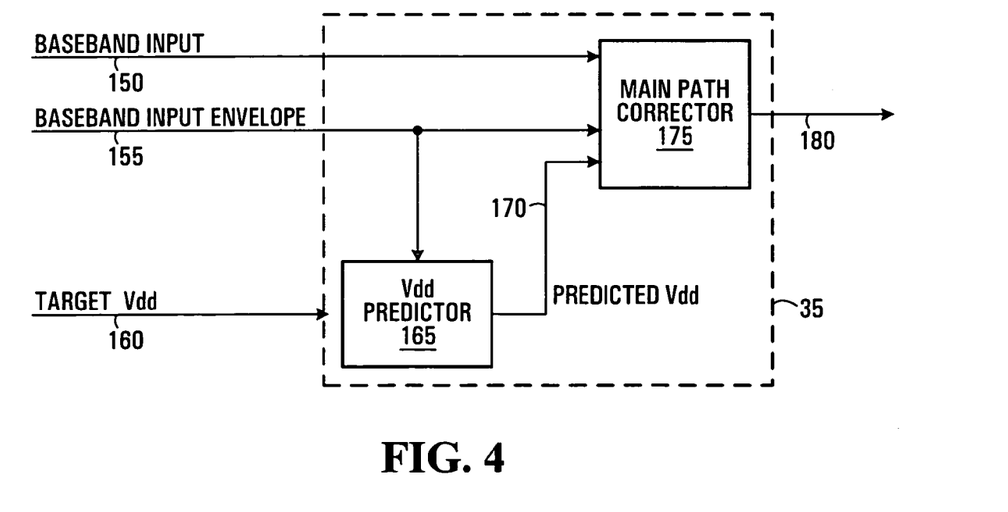
FIG. 4 is a block diagram of a memory correction module of the power amplifier arrangement of FIG. 3, provided by an embodiment of the invention.

With reference to FIG. 4, an example implementation of the memory correction module 35 of FIG. 3 will now be described in further detail. The memory correction module 35 includes a main-path corrector 175 and a Vdd predictor 165. Inputs to the Vdd predictor 165 include a target Vdd signal 160 and a baseband input envelope signal 155. The Vdd predictor 165 generates an output in the form of a predicted Vdd power supply signal 170. Inputs to the main-path corrector 175 include a baseband input signal 150, the baseband input envelope signal 155, and the predicted Vdd power supply signal 170. The output 180 of the main-path corrector 175 is a signal that is pre-distorted in a manner that allows the BPM 26 to output a substantially linearized and distortion-free amplified version of the signal supplied to the power amplifier arrangement 11.

The Vdd predictor 165 functions to predict Vdd waveform distortion in order to enhance the correction performance over that of conventional linearization techniques. This is accomplished by creating a forward model of the modulator path.

In the memory correction module 35, the main-path corrector 175 uses the predicted Vdd power supply signal 170 output from the Vdd predictor 165 to aid in pre-distorting the signal supplied to the BPM to result in a linearized output.

In the example embodiment of FIG. 4, dividing the linearization problem into two smaller problems that can be addressed by the main-path corrector 175 and the Vdd predictor 165 avoids an increase in computational complexity. Moreover, by using the concept of Vdd prediction, the need to invert the potentially ill behaved Vdd characteristic is avoided.

In the implementation shown in FIG. 4, the main-path corrector 175 and the Vdd predictor 165 are shown as two distinct functional elements. In some embodiments, the functionality of both blocks may be performed as a single element.

In the implementation shown in FIG. 4, as previously discussed, inputs supplied to the memory correction module 35 include baseband input signal 150, baseband input envelope signal 155 and target Vdd signal 160. In some embodiments, baseband input signal 150 could be used to generate baseband envelope signal 155 within the memory correction module 35 and the generated baseband envelope signal 155 supplied to both the main-path corrector 175 and the Vdd predictor 165. For example, as described above with regard to an envelope detector being included within the memory correction module 35. In embodiments such as this only baseband input signal 150 and target bandlimited Vdd signal 160 would be input to the memory correction module 35.

In some embodiments the main-path corrector 175 and the Vdd predictor 165 are implemented as hardware. In other embodiments, the main-path corrector 175 and the Vdd predictor 165 are implemented as software. Examples of hardware that might be used to implement the main-path corrector 175 and the Vdd predictor 165 include an application-specific integrated circuit (ASIC), a microprocessor with hardwired digital logic capable of performing the operations for solving the equations, a digital signal processing chip that can perform mathematical calculations based on algorithmic code stored in a computer readable memory or a field programmable gate array (FPGA). These examples are not meant to limit the invention, but to suggest architectures that could be used to implement embodiments of the invention.

Figure 5:
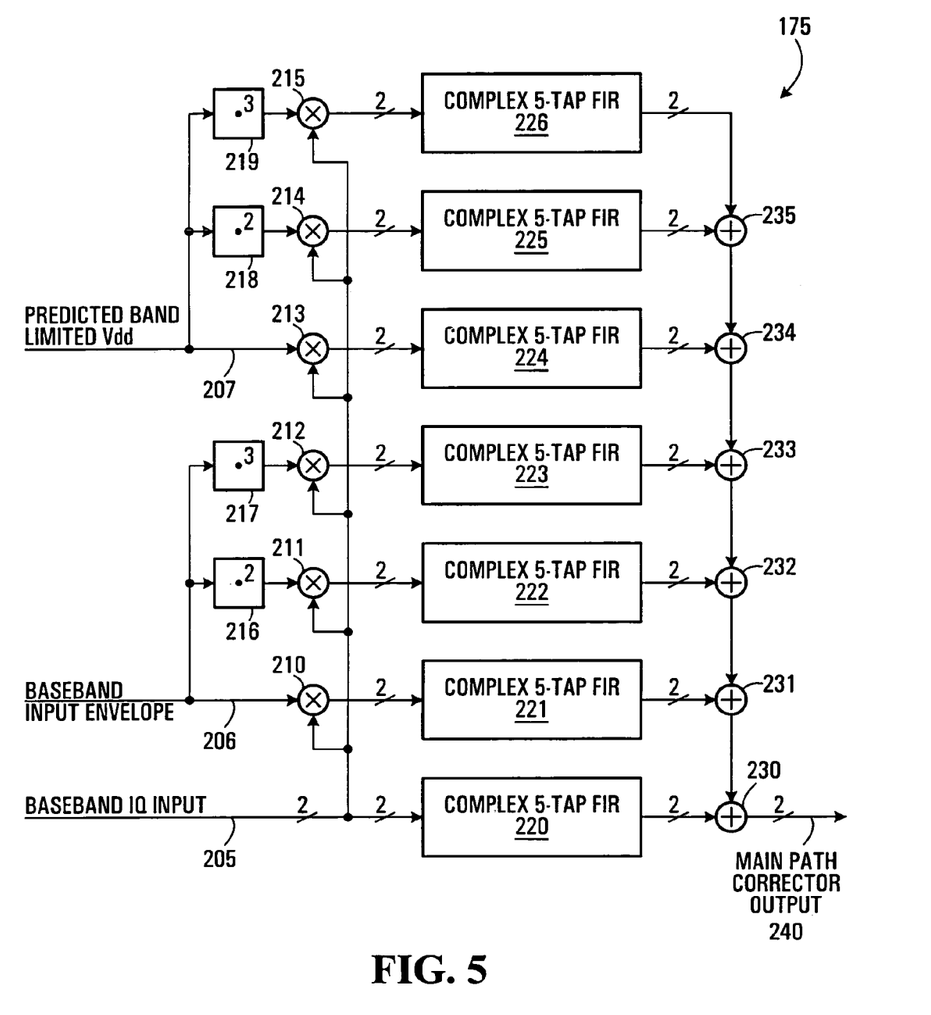
FIG. 5 is a schematic of a main-path corrector of the memory correction module of FIG. 4, provided by an embodiment of the invention.

An example transfer function output from an embodiment of the main-path corrector 175 is represented by $$y(n) = a_0 x(n) + a_1 x(n-1) + \ldots + a_4 x(n-4) + a_5 x(n)|x(n)| + \quad (1)$$
$$a_6 x(n-1)|x(n-1)| + \ldots + a_9 x(n-4)|x(n-4)| + a_{10} x(n)|x(n)|^2 +$$
$$a_{11} x(n-1)|x(n-1)|^2 + \ldots + a_{14} x(n-4)|x(n-4)|^2 +$$
$$a_{15} x(n)|x(n)|^2 + a_{16} x(n-1)|x(n-1)|^2 + \ldots +$$
$$a_{19} x(n-4)|x(n-4)|^2 + a_{20} x(n) v_{dd}(n) + a_{21} x(n-1) v_{dd}(n-1) + \ldots +$$
$$a_{24} x(n-4) v_{dd}(n-4) + a_{25} x(n) v_{dd}(n)^2 + a_{26} x(n-1) v_{dd}(n-1)^2 +$$
$$\ldots + a_{29} x(n-4) v_{dd}(n-4)^2 + a_{30} x(n) v_{dd}(n)^3 +$$
$$a_{31} x(n-1) v_{dd}(n-1)^3 + \ldots + a_{34} x(n-4) v_{dd}(n-4)^3,$$

where x(n) is a complex baseband input, Vdd(n) is a predicted Vdd waveform, and y(n) is a complex main-path corrector output. The coefficients $a_i$ are complex valued parameters. These might be determined during the memory correction training phase, which will be described below.

Equation (1) represents an example transfer function that may be used to implement the functionality of the main-path corrector 175. More generally, any transfer function capable of generating the required linearization functionality with appropriate inputs being a function of the target Vdd waveform and a function of the input to the power amplifier arrangement could be used to implement the functionality of the main-path corrector 175. In equation 1, the memory effect can be seen from the fact that the output y(n) is a function of inputs at times n, n-1, n-2, n-3 and n-4. The non-linear effects can be seen in the terms of the form $|x(\cdot)|^m$, $vdd(\cdot)^m$ and $X(\cdot)^m Vdd(\cdot)^k$ appearing in the equation. Other combinations of time elements and terms may be employed.

With reference to FIG. 5, an example implementation of the main-path corrector transfer function introduced in Equation (1) will now be described in further detail.

Baseband IQ Input 205 is supplied directly to a first complex 5-tap finite impulse response (FIR) filter 220. An output of the first complex 5-tap FIR filter 220 is supplied to adder 230. Baseband IQ Input 205 is also supplied to a plurality of multipliers 210,211,212,213,214,215 in which Baseband IQ Input 205 is multiplied by either Baseband Input Envelope 206, the square of Baseband Input Envelope 206, the cube of Baseband Input Envelope 206, Predicted Vdd 207, the square of Predicted Vdd 207 or the cube of Predicted Vdd 207. Multiplier 210 multiplies Baseband IQ input 205 and Baseband Input Envelope 206. An output of multiplier 210 is supplied to a second complex 5-tap FIR filter 221. An output of the second complex 5-tap FIR filter 221 is supplied to adder 231. Baseband Input Envelope 206 is also supplied to functional block 216 for squaring Baseband Input Envelope 206. An output of the functional block 216 is supplied to multiplier 211. Multiplier 211 multiplies Baseband IQ Input 205 and the squared value of Baseband Input Envelope 206. An output of multiplier 211 is supplied to a third complex 5-tap FIR filter 222. An output of the third complex 5-tap FIR filter 222 is supplied to adder 232. Baseband Input Envelope 206 is also supplied to functional block 217 for cubing Baseband Input Envelope 206. An output of the functional block 217 is supplied to multiplier 212. Multiplier 212 multiplies Baseband IQ Input 205 and the cubed value of Baseband Input Envelope 206. An output of multiplier 212 is supplied to a fourth complex 5-tap FIR filter 223. An output of the fourth complex 5-tap FIR filter 223 is supplied to adder 233.

Baseband IQ Input 205 is multiplied by Predicted Vdd 207, the square of Predicted Vdd 207, and the cube of Predicted Vdd 207 in the same fashion as described with respect to Baseband IQ Input 205 and Baseband Input Envelope 206 described above using multipliers 213, 214, and 215, and functional squaring and cubing blocks 218 and 219. Outputs of complex 5-tap FIR filters 220, 221, 222, 223, 224, 225 and 226 are summed together with adders 230, 231, 232, 233, 234, and 235 to create main path corrector output 240.

In the above example, main path corrector output 240 is shown to be a function of third degree polynomial expressions of Baseband Input Envelope 206 and Predicted Vdd 207. This is merely one embodiment provided by the invention shown for the sake of explanation. In other embodiments, the transfer function can involve higher or lower polynomial expressions of Baseband Input Envelope 206 and Predicted Vdd 207 by adding or removing functional blocks similar to 216, 217, 218 and 219, so as to provide a desired order polynomial. Similarly, the complex FIR filters are shown to be 5-tap filters merely for explanation purposes. In other embodiments, the FIR filters may have more or less taps depending on the desired delay.

In FIG. 5 the complex multi-tap filters are shown to be FIR filters, more generally these multi-tap filters can be other types of filters that have a desired delay functionality.

In FIG. 5, multiple adders are shown to sum the outputs of the multiple multi-tap filters. More generally any suitable number of adders could be used, for example one adder could be supplied with outputs from all the multiple multi-tap filters.

FIG. 5 is one example of how the transfer function of Equation (1) could be implemented The example implementation of FIG. 5 is not meant to limit the manner of implementation of the transfer function. More generally, any appropriate combination of mathematical operations could be used to implement a desired transfer function.

As described with respect to FIG. 4, hardware or software can be physically used to implement the functionality of the main-path corrector 175, for example the transfer function represented in FIG. 5.

In some embodiments, the Baseband IQ Input 205 includes respective I and Q components of a quadrature modulated signal. In an embodiment where I and Q components of a quadrature modulated signal are included in the Baseband IQ Input 205, at least two channels are used carrying Baseband IQ Input 205 as shown in the embodiment of FIG. 5.

Figure 6:
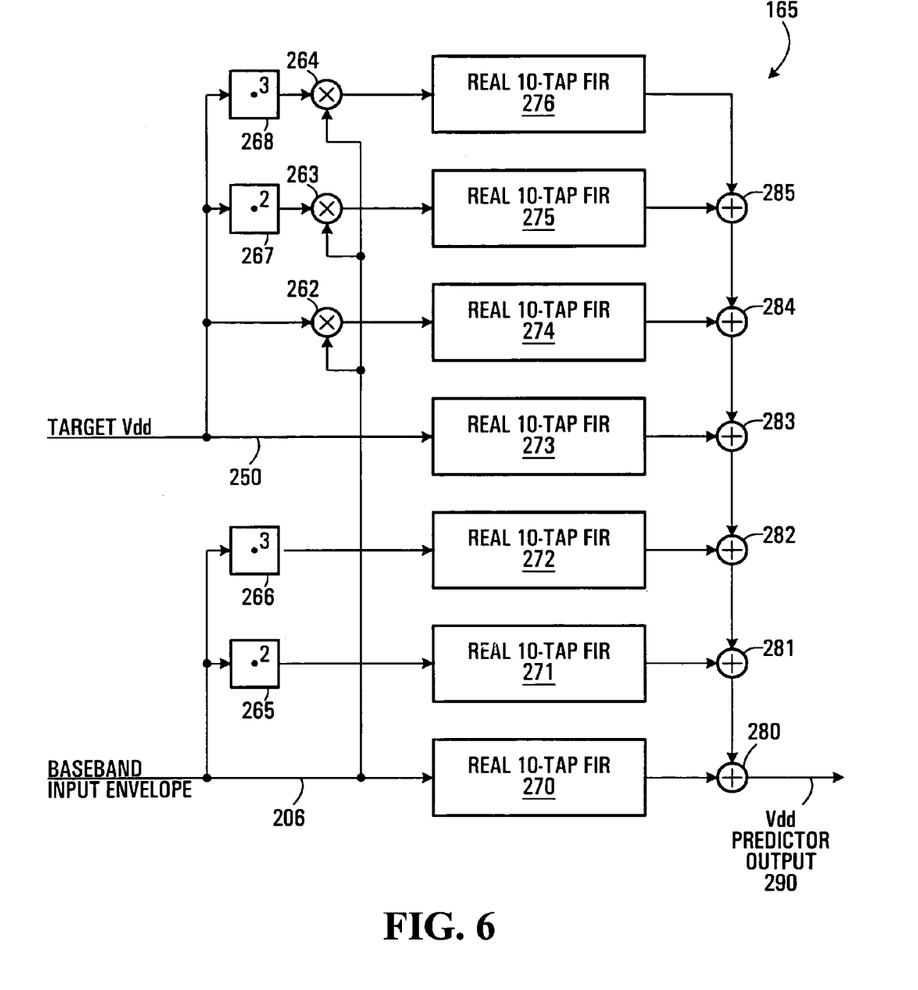
FIG. 6 is a schematic of a Vdd predictor of the memory correction module of FIG. 4, provided by an embodiment of the invention.

An example transfer function of an embodiment of the Vdd predictor 165 is represented as $$y(n) = b_0 x(n) + b_1 x(n-1) + \ldots + b_9 x(n-9) + b_{10} x(n)^2 + \quad (2)$$
$$b_{11} x(n-1)^2 + \ldots + b_{19} x(n-9)^2 + b_{20} x(n)^3 + b_{21} x(n-1)^3 + $$
$$\ldots + b_{29} x(n-9)^3 + b_{31} Vdd(n) + b_{32} Vdd(n-1) + \ldots + $$
$$b_{39} Vdd(n-9) + b_{40} x(n) Vdd(n) + b_{41} x(n-1) Vdd(n-1) + \ldots + $$
$$b_{49} x(n-9) Vdd(n-9) + b_{50} x(n) Vdd(n)^2 + b_{51} x(n-1) Vdd(n-1)^2 + $$
$$\ldots + b_{59} x(n-9) Vdd(n-9)^2 + b_{60} x(n) Vdd(n)^3 + $$
$$b_{61} x(n-1) Vdd(n-1)^3 + \ldots + b_{69} x(n-9) Vdd(n-9)^3,$$

where $x(n)$ is a baseband input envelope, $Vdd(n)$ is a target Vdd waveform, and $y(n)$ is an Vdd predictor output. The coefficients $b_i$ are real-valued parameters that might be determined during the memory correction training phase, which will discussed below.

Equation (2) represents an example transfer function that is used to implement the functionality of the Vdd predictor 165. More generally, a transfer function capable of generating the required predictor functionality with appropriate inputs being a function of the target Vdd waveform and a function of the input to the power amplifier arrangement could be used to implement the functionality of the Vdd predictor 165.

With reference to FIG. 6, an example implementation of the Vdd prediction transfer function introduced in Equation (2) will now be described in further detail.

Baseband Input Envelope 206 is supplied directly to a first real 10-tap FIR filter 270. An output of the first real 10-tap FIR filter 270 is supplied to adder 280. Baseband Input Envelope 206 is also supplied to functional block 265 for squaring Baseband Input Envelope 206. An output of functional block 265 is supplied to a second real 10-tap FIR filter 271. An output of the second real 10-tap FIR filter 271 is supplied to adder 281. Baseband Input Envelope 206 is also supplied to functional block 266 for cubing Baseband Input Envelope 206. An output of functional block 266 is supplied to a third real 10-tap FIR filter 272. An output of the third real 10-tap FIR filter 272 is supplied to adder 282.

Baseband Input Envelope 206 is also supplied to a plurality of multipliers 262,263,264 in which Baseband Input Envelope 206 is multiplied by Target Vdd 250, or a multiple of Target Vdd 250.

Target Vdd 250 is supplied directly to a fourth real 10-tap FIR filter 273. An output of the fourth real 10-tap FIR filter 273 is supplied to adder 283. Target Vdd 250 is also supplied to multiplier 262. Multiplier 262 multiplies Baseband Input Envelope 206 and Target Vdd 250. An output of multiplier 262 is supplied to a fifth real 10-tap FIR filter 274. An output of the fifth real 10-tap FIR filter 274 is supplied to adder 284. Target Vdd 250 is also supplied to functional block 267 for squaring Target Vdd 250. An output of the functional block 267 is supplied to multiplier 263. Multiplier 263 multiplies Baseband Input Envelope 206 and the squared value of Target Vdd 250. An output of multiplier 263 is supplied to a sixth real 10-tap FIR filter 275. An output of the sixth real 10-tap FIR filter 275 is supplied to adder 285. Baseband Input Envelope 206 is also supplied to functional block 268 for cubing Target Vdd 250. An output of the functional block 268 is supplied to multiplier 264. Multiplier 264 multiplies Baseband Input Envelope 206 and the cubed value of Target Vdd 250. An output of multiplier 264 is supplied to a seventh real 10-tap FIR filter 276. An output of the seventh real 10-tap FIR filter 276 is supplied to adder 285. Outputs of the real 10-tap FIR filters 270, 271, 272, 273, 274, 275 and 276 are summed together with adders 280, 281, 282, 283, 284, and 285 to create Vdd Predictor Output 290.

In the above example, Vdd Predictor Output 290 is shown to be a function of third degree polynomial expressions of Baseband Input Envelope 206 and Target Vdd 250. There are also cross product terms of both the target Vdd and the input envelope. This is merely one embodiment provided by the invention shown for the sake of explanation. In other embodiments, the transfer function can involve higher or lower polynomial expressions of Baseband Input Envelope 206 and Target Vdd 250 by adding or removing functional blocks similar to 265, 266, 267 and 268, so as to provide a desired order polynomial. Similarly, the real FIR filters are shown to be 10-tap filters merely for explanation purposes. In other embodiments, the FIR filters may have more or less taps depending on the required delay.

In FIG. 6, the real multi-tap filters are shown to be FIR filters, more generally these multi-tap filters can be other types of filters that have a desired delay functionality.

In FIG. 6, multiple adders are shown to sum the outputs of the multiple multi-tap filters. More generally any suitable number of adders could be used, for example one adder could be supplied with outputs from the multiple multi-tap filters.

FIG. 6 is one example of how the transfer function of Equation (2) could be implemented. The example implementation of FIG. 6 is not meant to limit the manner of implementation of the transfer function. More generally, any appropriate combination of mathematical operations could be used to implement a desired transfer function. Moreover, the equation (2) is but one example of a suitable transfer function.

As described with respect to FIG. 4, hardware or software can be used to physically implement the functionality of the Vdd predictor 165, for example the transfer function represented in FIG. 6.

In some embodiments additional filtering of the input envelope signal may occur before the input envelope signal is supplied to the Vdd modulator 21 and/or before the input envelope signal is supplied to the memory correction module 35. For example low pass filtering might be performed to filter high frequency components created during rectification.

In some embodiments the input envelope signal is created from a clean version of the input signal, such as a digital copy as described above.

In some embodiments a digital-to-analog converter is located between the memory correction module 35 and the BPM 26 in the main signal path to convert a digital output from the memory correction module 35 into an analog signal before being amplified by the BPM 26.

In order to maximize both a data path signal-to-noise ratio (SNR) and an available coefficient dynamic range for the main-path corrector 175 and the Vdd predictor 165 a hybrid fixed point/floating point architecture is used in some embodiments of the invention. In this architecture, all multiplications are realized in a floating-point domain, while the results are summed in a fixed-point domain. The hybrid architecture is well suited to the constraints of a FPGA implementation, particularly where the wordlength of "hard" multiplier resources is limited With reference to FIG. 7, an example of the hybrid fixed point/floating point architecture will now be described in further detail.

Figure 7:
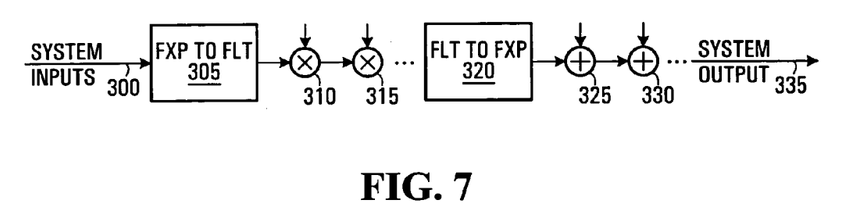
FIG. 7 is a block diagram of a hybrid fixed point/floating point architecture used in an embodiment of the invention.

System inputs 300 are supplied to a functional block 305 that converts a fixed-point (FXP) representation to a to floating-point (FLT) representation. With respect to the main-path correction 175 of FIG. 5, system inputs include Baseband IQ Input 205, Baseband Input Envelope 206, Predicted Vdd 207. With respect to the Vdd predictor 165 of FIG. 6, system inputs include Baseband Input Envelope 206 and Target Vdd 250.

An output of functional block 305 is supplied to multiplication functions 310 and 315. Multiplication functions 310 and 315 are performed in the floating-point domain. Multiplication functions 310 and 315 represent multiplication functionality such as squaring and cubing function blocks 216 and 217 in FIG. 5 as well as multiplication functionality performed by dedicated multipliers, for example multipliers 210, 211, 212 in FIG. 5, and the multipliers (not shown) inside the FIR filters. The resulting products are converted back to fixed-point representation in functional block 320. An output of functional block 320 is supplied to summation functions 325 and 330. Summation functions 325 and 330, which represent summing functions such as adders 230 and 231 in FIG. 5 as well as summation of filter phases, and addition performed inside the FIR filters, are performed in the fixed-point domain. System output 335 is then supplied in the desired representation. Preparing the system output 335 may include saturation of the resultant fixed-point number before being output.

The fixed-point representation of a number may be expressed in one of several formats, for example two's complement format or an unsigned format. The floating-point representation is typically expressed using a mantissa and an exponent.

Another aspect provided by embodiments of the invention is an architecture for training either one of or both the main-path corrector 175 and the Vdd predictor 165 in the main-path corrector module 35. In some embodiments training refers to generating appropriate programmable parameters such as coefficients $a_i$ and $b_i$ that appear in the example transfer functions of Equations (1) and (2). More generally, many methods of obtaining the memory correction module may be employed.

In order to facilitate rapid development and tuning of appropriate programmable parameters, the underlying training method used for the main-path corrector 175 and the Vdd predictor 165, in some embodiments, is a least-squares optimization of the form:

$$\phi=[U^H \cdot U]^{-1} Y \quad (3)$$

where U is a M×N matrix of system inputs, Y is a M×1 vector of the corresponding outputs, φ is a N×1 vector of the resulting coefficients, and M is the number of samples captured per iteration and superscript H with respect to $U^H$ represents a conjugate transpose operator. The contents of the matrix U and the vector Y depend on whether the main path corrector 175 or the Vdd predictor 165 is being trained. Both situations will be described below.

An example of solving this type of least-squares optimization can be found in Matlab™ software in the form:

$$\phi = U \backslash Y \quad (4)$$

where the backslash operator is used for providing a solution in a least-squares sense to an over-constrained problem $U \cdot \phi = Y$.

In the example of FIG. 5, the system inputs in matrix U are some combination of Baseband IQ Input 205, Baseband Input Envelope 206, and Predicted Vdd 207 and the system outputs in vector Y are Corrector output 240. In the example of FIG. 6, the system inputs in matrix U are some combination of Baseband Input Envelope 206 and Target Vdd 250 and the system outputs in vector Y are Vdd Predictor Output 290.

In order to increase the effective accuracy of training results for the given polynomial orders of the main-path corrector module 175 and the Vdd predictor module 165, in some embodiments the solution space is divided up into a number of segments each based on a range of input envelope values. In this way, a different set of coefficients for each segment is determined. This facilitates the use of a series of lower-order polynomials to approximate the behaviour of a single higher-order polynomial. This, in turn leads to a significant reduction in physical implementation complexity. Alternatively, increased performance can be achieved by segmenting without changing the polynomial order.

Figure 8:
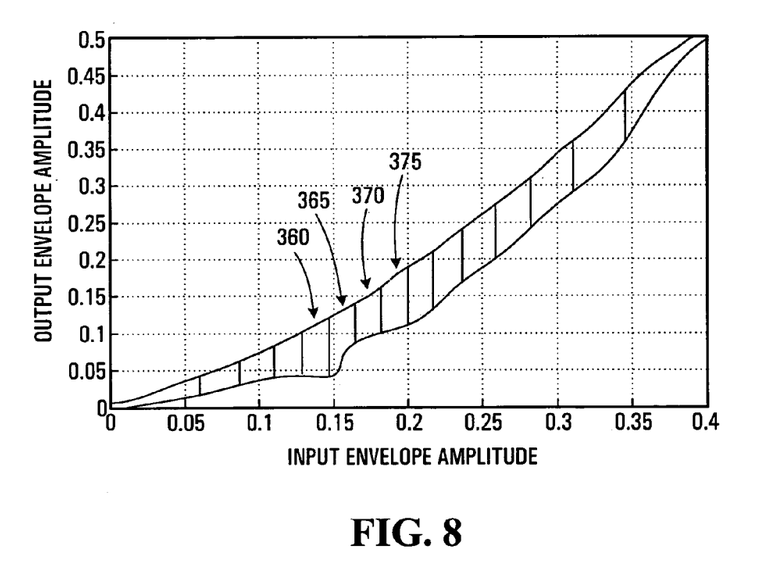
FIG. 8 is a graphical depiction of an example of segmenting of input data used in some embodiments of the invention to reduce calculation complexity during training and/or to increase performance.

Referring now to FIG. 8, an example of a relationship between an input envelope signal amplitude and an output envelope signal amplitude is shown. The input envelope signal amplitude along the x-axis of the graph is divided into multiple distinct segments 360,365,370,375 each segment having a particular input envelope signal amplitude range. Output envelope amplitudes along the y-axis of the graph correspond to particular input envelope signal amplitude ranges. Applying the concept of segmenting as illustrated in FIG. 8 to the inputs output of the main-path corrector 175, the programmable parameters are determined in some embodiments as described above and those parameters are then applied by the main-path corrector 175 to determine the main-path corrector output 240, when similar input values are captured during operation. A similar segmenting process for use in the determination of the programmable parameters is applied to the Vdd predictor 165 in some embodiments provided by the invention.

Again with regard to FIGS. 5 and 6, the segmenting translates into calculating φ for each range of appropriate input values that define a corresponding segment. This is easily accomplished for the transfer function by only selecting rows of Y and U that fall in the appropriate input value range. Then the transfer function is solved with respect to φ. Using Equation (3) and solving for φ with respect to the main-path corrector 175 provides the $a_i$ coefficients for the transfer function of Equation (1). Using Equation (3) and solving for φ with respect to the Vdd predictor 165 provides the $b_i$ coefficients for the transfer function of Equation (2). In the embodiments represented by FIGS. 5 and 6, these coefficients represent weighting values to be used in the multi-tap FIR filters. Embodiments for main-path corrector 175 and Vdd predictor 165 training architectures will be further described below.

In some embodiments when segmenting of the input signals is performed, an overlap between adjacent segments is provided. By providing the overlap between adjacent segments, a transition zone is created between adjacent segments. Therefore, distortions of an amplified output signal that might occur due to segmenting, that is when the input signals observed by the main-path corrector 175 or the Vdd predictor 165 change to a different segment resulting in a change of the programmable parameters, may be reduced or eliminated. Various methods of transitioning between solutions in the overlap of segments might be explored. For example, a switch in the programmable parameters can be made at the midpoint of the overlap.

The total number of segments used in the segmenting of the solution space may have an effect on the order of the polynomial of the expression that is to be solved. Controlling the number of segments may result in an ability to control the complexity of the physical implementation used for embodiments of the invention. The greater the number of segments, generally the lower the order of the polynomial expression that can be used to represent that segment. Conversely, the fewer the number of segments, generally the higher the order of the polynomial expression used to represent that segment.

Similarly, the amount of overlap selected in segmenting may determine a level of distortion in the amplified output signal. Selecting the amount of overlap between adjacent segments may have an effect on the level of complexity of the physical implementation used for embodiments of the invention.

Generally, the range of the segments and the amount of overlap are selected according to requirements of the user in relation to a desired solution complexity and overall performance.

In some embodiments, the use of segmenting could be exploited to parallelize the training process in order to reduce a time required for convergence of the programmable parameters. Conversely, in some embodiments, the use of segmenting could be exploited to serialize the training process in order to minimize complexity of the physical implementation, for example hardware requirements.

In the case of training the Vdd predictor 165 of FIG. 6, in some embodiments, the Baseband Input Envelope 206 and/or the Target Vdd 250 are each segmented based on amplitude values of the respective inputs. A corresponding Vdd predictor Output 290 is also determined. Using the segmented inputs and corresponding outputs the programmable parameters are determined for that segment by using Equation (3). During operation, after the programmable parameters have been determined by training for each of the desired number of segments, the programmable parameters can be simply interchanged depending on the particular input values observed by the Vdd predictor 165. A similar segmentation approach may be applied to the main-path corrector in some embodiments provided by the invention.

In some embodiments, segmenting in a hardware realization of the main-path corrector 175 and the Vdd predictor 165 is accomplished by using time-varying coefficients. Each coefficient has an associated "memory" with a set of locations, for example 16 locations. For each input sample, an address is generated to select the appropriate coefficient value from the "memory" based on the input value This address generation process is controlled by a set of programmable registers that specify the envelope value ranges or segment boundaries that correspond to each of the possible addresses.

A training algorithm for the main-path corrector 175 is based on an "indirect learning" architecture. For each iteration, signal waveforms are captured and new coefficient values are calculated such that the main-path corrector 175 will have an inverse characteristic to that of the BPM 26. Updated coefficients are then transferred to the main-path corrector 175 and the next iteration is initiated.

Figure 9:
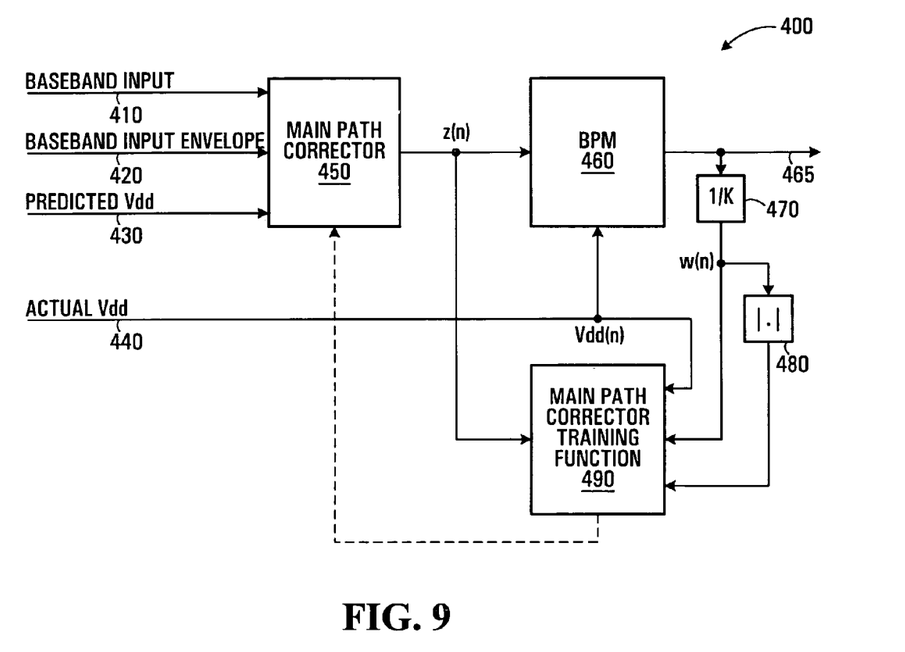
FIG. 9 is a block diagram of a main-path corrector architecture for determining programmable parameters as provided by an embodiment of the invention.

With reference to FIG. 9, an example of a main-path corrector training architecture will now be described in further detail.

Baseband input 410, Baseband Input Envelope 420, and Predicted Vdd 430 are supplied to a main-path corrector 450. An output of the main-path corrector 450 identified as z(n) is supplied to a BPM 460. An output 465 of the BPM 460 is an output of the power amplifier arrangement. The output 465 is also supplied to a functional block 470 where the output is multiplied by 1/K resulting in a value represented by w(n), K being the gain of the BPM. The signal represented by w(n) is supplied to a main-path corrector training function 490. The signal represented by w(n) is also supplied to a functional block 480 which is an envelope detector that determines a magnitude of w(n). The magnitude of w(n) is supplied to the main-path corrector training function 490. An actual Vdd power signal 440 represented by Vdd(n), which powers the BPM 460 is also supplied to the main-path corrector training function 490. The main-path corrector training function 490 determines $a_i$ coefficients for use by main path corrector 450.

Using the example transfer function implementation of main-path corrector 175 in FIG. 5 for the purpose of main-path correction training, variables U, φ and Y identified in Equation (3) are defined in accordance with:

$$U^T = \begin{bmatrix} w(n) & w(n-1) & w(n-2) & \cdots \\ w(n)|w(n)| & w(n-1)|w(n-1)| & w(n-2)|w(n-2)| & \cdots \\ w(n)|w(n)|^2 & w(n-1)|w(n-1)|^2 & w(n-2)|w(n-2)|^2 & \cdots \\ w(n)|w(n)|^3 & w(n-1)|w(n-1)|^3 & w(n-2)|w(n-2)|^3 & \cdots \\ w(n)v_{dd}(n) & w(n-1)v_{dd}(n-1) & w(n-2)v_{dd}(n-2) & \cdots \\ w(n)v_{dd}^2(n) & w(n-1)v_{dd}^2(n-1) & w(n-2)v_{dd}^2(n-2) & \cdots \\ w(n)v_{dd}^3(n) & w(n-1)v_{dd}^3(n-1) & w(n-2)v_{dd}^3(n-2) & \cdots \\ w(n-1) & w(n-2) & w(n-3) & \cdots \\ \vdots & \vdots & \vdots & \cdots \\ w(n-4)v_{dd}^3(n-4) & w(n-5)v_{dd}^3(n-5) & w(n-6)v_{dd}^3(n-6) & \cdots \end{bmatrix} \quad (5)$$

$$\varphi = \begin{bmatrix} a_0 \\ a_5 \\ a_{10} \\ a_{15} \\ a_{20} \\ a_{25} \\ a_{30} \\ a_1 \\ \vdots \\ a_{34} \end{bmatrix} \quad (6)$$

$$Y = \begin{bmatrix} z(n) \\ z(n-1) \\ z(n-2) \\ \vdots \end{bmatrix} \quad (7)$$

where Vdd(n) represents the actual Vdd power signal 440, w(n) represents the output signal of the BPM 460 multiplied by the 1/K, and z(n) represents the output signal of the main-path corrector 450, as shown in FIG. 9. The superscript T with respect to $U^T$ represents a transpose operator.

The representations of Equations (5), (6) and (7) are meant for illustrative purposes and are not meant to limit the invention. As described above, the transfer function representing the main-path corrector can be represented by any number of transfer functions. Therefore, Equations (5), (6) and (7) would be representative of the appropriate transfer function.

The Vdd predictor module 165 is trained as a forward model of modulator impairments of the Vdd modulator 21. As with the main-path corrector module 175, each training iteration begins with capture of appropriate signal waveforms. Then, new coefficient values are determined such that a predictor structure will be supplied with a forward characteristic of the Vdd modulator 21. Updated coefficients are then transferred to the Vdd predictor 165 and a next iteration is initiated.

Figure 10:
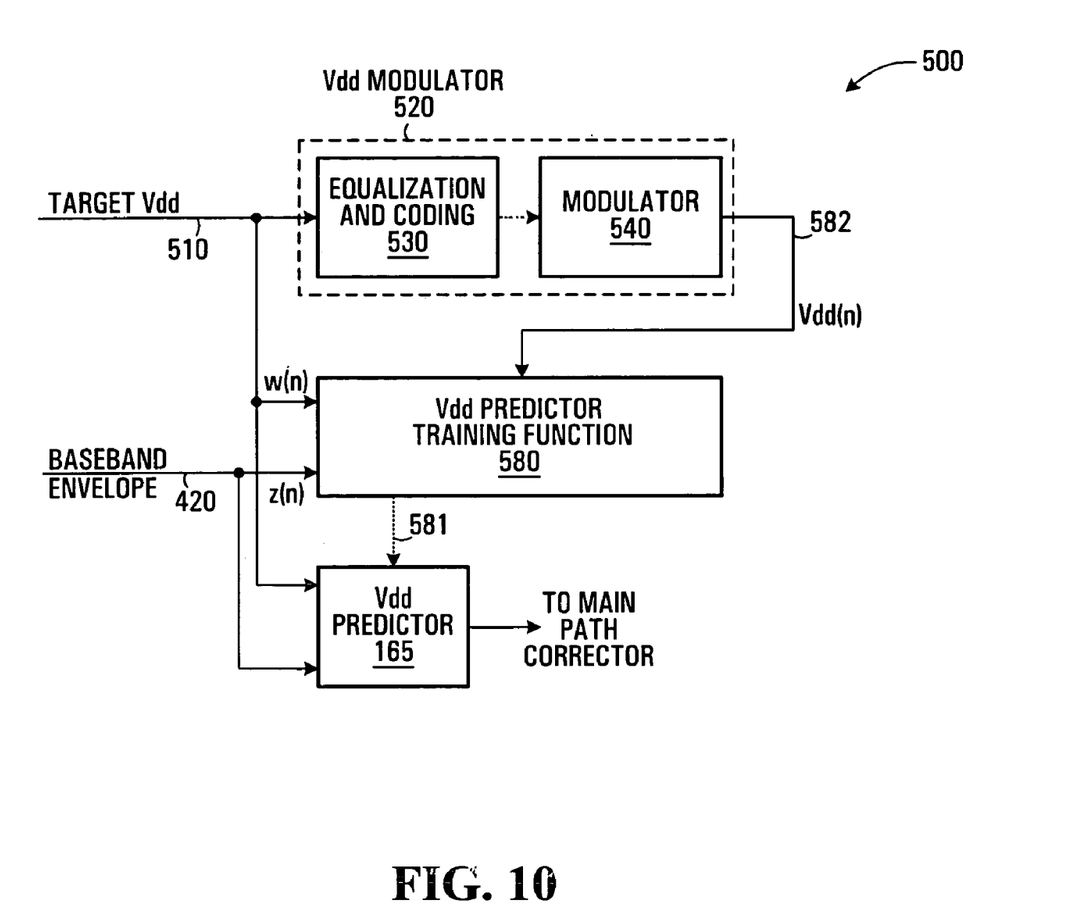
FIG. 10 is a block diagram of a Vdd predictor architecture for determining programmable parameters as provided by an embodiment of the invention.

With reference to FIG. 10, an example of an Vdd predictor training architecture will now be described in further detail. Target Vdd 510 is supplied to an input of the Vdd modulator 520. The Vdd modulator 520 as shown in FIG. 10 includes an equalization and coding block 530 coupled to a modulating block 540. There may be different and/or additional functions prior to the modulator. The input of the Vdd modulator 520 is supplied to the equalization and coding block 530. An output of the equalization and coding block 530 is supplied to the modulating block 540. An output of the modulating block 540 is an output of the Vdd modulator 520. The output of the Vdd modulator is an actual Vdd power signal represented as Vdd(n). The actual Vdd power signal 582 is supplied to the BPM (not shown).

Baseband Envelope 420 represented by z(n) is supplied to a Vdd predictor training function 580. The Target Vdd 510 is also supplied to the Vdd predictor training function 580 generating the $b_i$ coefficients 581. The Vdd predictor training function 580 generates an output 581 for training the Vdd predictor 165.

Using the example transfer function implementation of Vdd predictor 165 in FIG. 6 for the purpose of Vdd predictor training, variables U, φ and Y identified in Equation (3) are defined in accordance with:

$$U^T = \begin{bmatrix} z(n) & z(n-1) & z(n-2) & \cdots \\ z(n)^2 & z(n-1)^2 & z(n-2)^2 & \cdots \\ z(n)^3 & z(n-1)^3 & z(n-2)^3 & \cdots \\ w(n) & w(n-1) & w(n-2) & \cdots \\ z(n)w(n) & z(n-1)w(n-1) & z(n-2)w(n-2) & \cdots \\ z(n)w^2(n) & z(n-1)w^2(n-1) & z(n-2)w^2(n-2) & \cdots \\ z(n)w^3(n) & z(n-1)w^3(n-1) & z(n-2)w^3(n-2) & \cdots \\ z(n-1) & z(n-2) & z(n-3) & \cdots \\ \vdots & \vdots & \vdots & \cdots \\ z(n-4)w^3(n-4) & z(n-5)w^3(n-5) & z(n-6)w^3(n-6) & \cdots \end{bmatrix} \quad (8)$$

$$\varphi = \begin{bmatrix} b_0 \\ b_{10} \\ b_{20} \\ b_{30} \\ b_{40} \\ b_{50} \\ b_{60} \\ b_1 \\ \vdots \\ b_{69} \end{bmatrix} \quad (9)$$

$$Y = \begin{bmatrix} Vdd(n) \\ Vdd(n-1) \\ Vdd(n-2) \\ \vdots \end{bmatrix} \quad (10)$$

where Vdd(n) represents the actual Vdd power signal, w(n) represents the target Vdd power signal, and z(n) represents the input baseband signal, as shown in FIG. 10. The superscript T with respect to $U^T$ represents a transpose operator.

The representations of Equations (8), (9) and (10) are meant for illustrative purposes and are not meant to limit the invention. As described above, the transfer function representing the Vdd predictor can be represented by any number of transfer functions. Therefore, Equations (8), (9) and (10) would be representative of the appropriate transfer function.

In some embodiments, training algorithms are implemented based on the architecture described with respect to FIGS. 9 and 10 for main-path correction and Vdd prediction, respectively. Any appropriate training algorithm can be used. For example, in some embodiments training algorithms involve methods such as RLS (Recursive Least Squares) or recursive Levenberg-Marquardt instead of the least squares optimization method of Equation (3). In some embodiments the training algorithms are implemented in hardware. In other embodiments the algorithms are implemented in software. In some embodiments provided by the invention the algorithms are included as part of the hardware or software of the main-path corrector 175 or the Vdd predictor 165, respectively. In other embodiments the training algorithms are a separate functional block from the main-path corrector 175 or the Vdd predictor 165.

In some embodiments of the described power amplifier arrangement, captured main-path data exhibits a phase drift over time with respect to the input supplied to the power amplifier arrangement. In order to compensate for this effect, a running average of phase error may be calculated. The running average is then used to calculate a time-varying phase compensation waveform that is applied to the captured main-path data in order to smooth the time-domain phase behaviour.

Embodiments of the power amplifier arrangement as described above can be used in wireless base station transmitters. More generally, embodiments of the power amplifier arrangement are used in any communication network where power amplifiers are used.

Numerous modifications and variations of the present invention are possible in light of the above teachings. It is therefore to be understood that within the scope of the appended claims, the invention may be practised otherwise than as specifically described herein.

The invention claimed is:

1. A power amplifier arrangement comprising:
    a power supply adapted to supply a power supply signal to a power amplifier, the power supply being modulated as a function of an input signal supplied to the power amplifier arrangement;
    the power amplifier adapted to receive a modified version of the input signal and amplify the modified version of the input signal to produce an output signal;
    wherein the input signal is modified as a function of the input signal supplied to the power amplifier arrangement and a prediction of distortion of the power supply signal supplied to the power amplifier to produce the modified version of the input signal.

2. A power amplifier arrangement according to claim 1, wherein the power amplifier arrangement includes a memory correction module adapted to provide the modified input signal supplied to the power amplifier, the memory correction module modifying the input signal as a function of the input signal to the arrangement and a prediction of distortion of the power supply signal supplied to the power amplifier, the memory correction module being trained as a function of the output signal.

3. A power amplifier arrangement according to claim 2, wherein the memory correction module modifies the input signal as a function of a prediction of distortion of the power supply signal, wherein the distortion results from a dynamic impedance effect of the power amplifier as seen by the power supply.

4. A power amplifier arrangement according to claim 2, wherein the memory correction module modifies the input signal as a function of an input signal envelope of the input signal supplied to the power amplifier arrangement.

5. A power amplifier arrangement according to claim 2, wherein the memory correction module is comprised of:
    a Vdd predictor adapted to predict waveform distortion of the power supply signal, wherein the Vdd predictor generates an output that is a function of a target power supply signal, the target power supply signal being modulated as a function of the input signal and unaffected by the waveform distortion; and
    a main-path corrector adapted to modify the input signal supplied to the power amplifier arrangement as a function of the input signal supplied to the power amplifier arrangement and the output of the Vdd predictor.

6. A power amplifier arrangement according to claim 5, wherein inputs supplied to the main-path corrector comprise an input signal, the output of the Vdd predictor and an input envelope signal.

7. A power amplifier arrangement according to claim 5, wherein inputs supplied to the Vdd predictor comprise an input envelope signal and the target power supply signal.

8. A power amplifier arrangement according to claim 5, further comprising means for generating an input envelope signal prior to the Vdd predictor and the main-path corrector.

9. A power amplifier arrangement according to claim 1, further comprising means for modulating the power supply signal as a function of the input signal.

10. A power amplifier arrangement according to claim 9, wherein means for modulating the power supply signal are a function of an input envelope signal.

11. A power amplifier arrangement according to claim 9, wherein means for modulating the power supply signal comprise rectification of the input signal.

12. A power amplifier arrangement according to claim 11, wherein means for modulating the power supply signal further comprise filtering of the input signal.

13. A power amplifier arrangement according to claim 2, wherein the memory correction module is an application specific integrated circuit (ASIC).

14. A power amplifier arrangement according to claim 2, wherein the memory correction module is a field programmable gate array (FPGA).

15. A power supply arrangement according to claim 5 further comprising:
 a Vdd predictor training function adapted to train the Vdd predictor;
 a main path corrector training function adapted to train the main path corrector.

16. A power amplifier arrangement according to claim 15 wherein:
 the Vdd predictor training function is adapted to train the Vdd predictor using the target power supply signal, the power supply signal and the input signal;
 the main path corrector training function is adapted to train the main path corrector using the modified input signal, the output signal and the power supply signal.

17. A computer useable medium having computer readable program code means embodied therein for performing memory correction in a power amplifier arrangement according to claim 1, the computer readable code means comprising:
 code means for predicting waveform distortion of the power supply signal, wherein the code means generates an output that is a function of a target power supply signal, the target power supply signal being modulated as a function of the input signal supplied to the amplifier arrangement and unaffected by the waveform distortion; and
 code means for modifying the input signal supplied to the power amplifier arrangement as a function of the input signal to the power amplifier arrangement and the output of the code means for predicting waveform distortion.

18. A method of operating a power amplifier arrangement comprising a power amplifier and a power supply, the method comprising the steps of:
 modulating a power supply signal of the power supply as a function of an input signal supplied to the power amplifier arrangement, the power supply signal being supplied to the power amplifier;
 modifying the input signal supplied to the power amplifier arrangement as a function of the input signal supplied to the power amplifier arrangement and a prediction of distortion of the power supply signal supplied to the power amplifier to produce the modified version of the input signal.

19. A method according to claim 18, wherein the step of modifying further includes the steps of:

Vdd prediction for predicting waveform distortion of the power supply signal, wherein the Vdd predictor generates an output that is a function of a target power supply signal, the target power supply signal being modulated as a function of the input signal supplied to the amplifier arrangement and unaffected by the waveform distortion; and
 main-path correction for modifying the input signal supplied to the power amplifier arrangement as a function of the input signal to the power amplifier arrangement and the output of the Vdd predictor.

20. A method according to claim 18, wherein the step of modifying further comprises converting signals represented in a fixed-point domain to signals represented in a floating-point domain and vice versa.

21. A method according to claim 19, further comprising a training step for determining programmable parameters used during at least one of Vdd prediction and main-path correction.

22. A method according to claim 21, wherein the training step involves using a least squares optmization process according to the equation $\phi=[U^{H}\cdot U]^{-1}Y$ where U is a M×N matrix of system inputs, Y is a M×1 vector of a corresponding outputs, $\phi$ is a N×1 vector of the resulting programmable parameters, M is a number of samples captured per iteration, N is a number of discrete sample weightings and superscript H pertaining to $U^H$ represents a conjugate transpose operator.

23. A method according to claim 21, wherein the training step involves segmenting of a solution space into a plurality of ranges to aid in reducing complexity of determining programmable parameters or to enhance performance.

24. A method according to claim 23, wherein a an overlap is provided between adjacent segments in the plurality of ranges.

25. A method according to claim 23, wherein the step of Vdd prediction further comprises the step of interchanging programmable parameters somewhere in the overlap.

26. A method according to claim 23, wherein the step of main-path correction further comprises the step of interchanging programmable parameters somewhere in the overlap.

27. A memory correction module for a power amplifier arrangement comprising:
 a Vdd predictor adapted for predicting waveform distortion of the power supply voltage, wherein the Vdd predictor generates an output that is a function of a target power supply voltage, the target power supply voltage modulated as a function of an input supplied to the power amplifier arrangement and unaffected by the waveform distortion; and
 a main-path corrector adapted for modifying the input supplied to the power amplifier arrangement as a function of the input to the power amplifier arrangement and the output of the Vdd predictor.

28. A wireless communications base station transmitter including a power amplifier arrangement according to claim 1.

29. A communications network including a power amplifier arrangement according to claim 1.

30. A method of providing a signal transmission service over a communications network including a power amplifier arrangement according to claim 1.

* * * * *

UNITED STATES PATENT AND TRADEMARK OFFICE
CERTIFICATE OF CORRECTION

PATENT NO. : 7,095,278 B2  Page 1 of 1
APPLICATION NO. : 10/900300
DATED : August 22, 2006
INVENTOR(S) : Arthur Thomas Gerald Fuller et al.

It is certified that error appears in the above-identified patent and that said Letters Patent is hereby corrected as shown below:

1) Column 8, equation 1, 4$^{th}$ line, "$a_{15}x(n)|x(n)|^2 + a_{16}x(n-1)|x(n-1)|^2 +...+$" should read -- $a_{15}x(n)|x(n)|^3 + a_{16}x(n-1)|x(n-1)|^3 +...+$ --;

2) Column 8, equation 1, 5$^{th}$ line, "$a_{19}x(n-4)|x(n-4)|^2 ...$" should read -- $a_{19}x(n-4)|x(n-4)|^3$ --;

3) Column 11, line 65, "With reference to FIG." should be a new paragraph;

4) Column 12, line 9, "An output of functional..." should continue with the previous paragraph;

5) Column 12, equation 3, "$\phi = [U^H \cdot U]^{-1} Y$" should read -- $\varphi = [U^H \cdot U]^{-1} Y$ --;

6) Column 12, line 51, "$\Phi$ is a Nx1..." should be -- $\varphi$ is a Nx1... --;

7) Column 12, eqation 4, "$\Phi = U\backslash Y$" should be -- $\varphi = U\backslash Y$ --;

8) Column 12, line 64, "$\Phi = Y$" should be -- $\varphi = Y$ --;

9) Column 13, line 37, the symbol "$\Phi$" should be -- $\varphi$ --;

10) Column 13, line 41, the symbol "$\Phi$" should be -- $\varphi$ --;

11) Column 13, line 42, the symbol "$\Phi$" should be -- $\varphi$ -- ;

12) Column 13, line 45, the symbol "$\Phi$" should be -- $\varphi$ --;

13) Column 15, line 14, the symbol "$\Phi$" should be -- $\varphi$ --;

14) Column 16, line 66, the symbol "$\Phi$" should be -- $\varphi$ --;

15) Column 20, claim 22, line 22, the symbol "$\Phi$" should be "$\varphi$"; and 16) Column 20, claim 22, line 24, the symbol "$\Phi$" should be "$\varphi$".

Signed and Sealed this

Seventeenth Day of February, 2009

JOHN DOLL
*Acting Director of the United States Patent and Trademark Office*